SUPERCONDUCTIVE QUANTUM INTERFERENCE DEVICE UTILIZING A SUPERCONDUCTIVE INDUCTIVE REACTIVE ELEMENT SHUNTED BY A SINGLE JUNCTION
Original Filed April 2, 1965

JOHN J. LAMBE
JAMES E. MERCEREAU
ARNOLD H. SILVER
JAMES E. ZIMMERMAN
INVENTORS
BY John L. Faulkner
Thomas H. Oster
ATTORNEY SUPERCONDUCTIVE QUANTUM INTERFERENCE DEVICE UTILIZING A SUPERCONDUCTIVE INDUCTIVE REACTIVE ELEMENT SHUNTED BY A SINGLE JUNCTION Original Filed April 2, 1965 2 Sheets-Sheet 2

JOHN J. LAMBE
JAMES E. MERCEREAU
ARNOLD H. SILVER
JAMES E. ZIMMERMAN
INVENTORS

BY John R. Faulkner
Thomas H. Oster
ATTORNEYS

United States Patent Office 3,506,913

Patented Apr. 14, 1970

3,506,913

SUPERCONDUCTIVE QUANTUM INTERFERENCE DEVICE UTILIZING A SUPERCONDUCTIVE INDUCTIVE REACTIVE ELEMENT SHUNTED BY A SINGLE JUNCTION

John J. Lambe, Birmingham, James E. Mercereau, Dearborn, Arnold H. Silver, Farmington, and James E. Zimmerman, Dearborn, Mich., assignors to Ford Motor Company, Dearborn, Mich., a corporation of Delaware Continuation of application Ser. No. 445,191, Apr. 2, 1965. This application June 28, 1968, Ser. No. 746,726

Int. Cl. G01r *33/02*

U.S. Cl. 324—43 17 Claims

ABSTRACT OF THE DISCLOSURE

A superconductive quantum interference device in which a superconductive inductive reactive element and a single junction shunting the element encloses a finite area for the reception of magnetic flux. An alternating potential of sufficiently high frequency is applied to the superconductive inductive reactive element to cause a voltage to appear across the junction and current to flow through it, and means are coupled to the quantum interference device for detecting quantum interference effects in the device. This device is usable as an extremely sensitive magnetometer, oscillator or amplifier. The invention also relates to a process for effecting superconductive interference by forming a superconductive inductive reactive element and a junction shunting the superconductive inductive reactive element in a loop enclosing a finite area. An alternating potential of sufficiently high frequency to cause current flow through the junction is applied to the superconductive inductive reactive element, and quantum interference effects in the junction are detected.

This is a continuation of application Ser. No. 445,191 filed Apr. 2, 1965, now abandoned.

This invention is concerned with a process and apparatus utilizing a superconducting quantum interference device as an extremely sensitive magnetometer. The device introduced by this invention can readily be employed as an oscillator or an amplifier. This device may be characterized as a single junction apparatus as distinguished from multiple junction devices.

A complete understanding of the instant invention requires a knowledge of the operation of multiple junction superconducting quantum interference devices. The operation of these multiple junction superconduction quantum interference devices is based upon the universal quantum wave properties of current carrying electrons in solids. Interference techniques operable upon all wave phenomena are employed to control or modulate the flow of electrons in a current carrying superconductor. This invention is carried out by causing a relative phase displacement between at least two currents flowing through a superconductor and combining these two currents after phase displacement has been achieved to obtain control or modulation of the current.

When two or more waves are brought together and caused to combine, the amplitude of the resulting wave depends upon the relative phase and amplitude of the combining waves. For the sake of clarity this discussion will be limited to the case of combining only two waves and that these waves be of the same original amplitude. It is to be recognized that this is only a very special case and the same logic and principles can be applied to the combination of any desired number of waves of any desired relative phase and amplitude.

In the event the two waves mentioned above combine "in phase" the amplitude of the resulting wave is larger than either of the initial waves. Similarly if the waves combine "out of phase" the resulting wave may have a zero amplitude. These two situations are the two extreme cases and all intermediate situations are possible with an intermediate amplitude and a corresponding shift in phase.

This situation may be described mathematically in connection with FIGURE 1 which is a purely schematic showing of a superconductive current path comprising two essentially parallel electrical paths.

Figure 1:
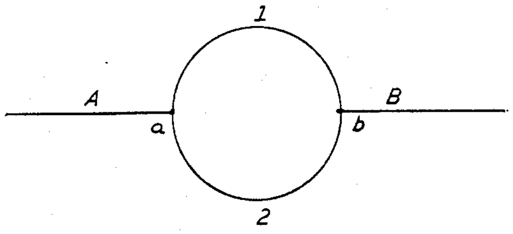

With reference to FIGURE 1, a wave (electrical current or electron flow) is caused to flow down path A and at (a) splits into two waves which flow along superconductive paths 1 and 2 and are combined at (b). The phase change gamma ($\gamma_1$) of the wave of wave length lambda ($\lambda$) along path 1 is defined as $$\gamma_1 = 2\pi \int_1 \frac{dl}{\lambda} \quad (1)$$

Similarly the phase change $\gamma_2$ of the wave of wave length along the path 2 is defined as $$\gamma_2 = 2\pi \int_2 \frac{dl}{\lambda} \quad (2)$$

The difference in phase at the point of juncture of the two waves approaching along paths 1 and 2 is denoted $\Delta\gamma$ and may be defined by the expression $$\Delta\gamma = 2\pi \left[ \int_1 \frac{dl}{\lambda} - \int_2 \frac{dl}{\lambda} \right] \quad (3)$$

Expression (3) is obtained by subtracting equation (2) from equation (1) and may be replaced by its full mathematical expression $$\Delta\gamma = 2\pi \oint \frac{dl}{\lambda} \quad (4)$$

where the line integral is taken around the combined path 1, 2. The wave travelling along each of these paths also oscillates in time with a frequency nu ($\nu$) and the phase has also progressed with time as defined by the expression $$2\pi \int \nu dt \quad (5)$$

Thus the total phase difference is $$\Delta\gamma = 2\pi \left[ \oint \frac{dl}{\lambda} + \int_1 \nu dt - \int_2 \nu dt \right] \quad (6)$$

The amplitude (I) of the wave resulting from the combination of the two waves from paths 1 and 2 must depend upon cos $\Delta\gamma$. Thus $$I=I_0\cos 2\pi\left[\oint\frac{dl}{\lambda}+\int_1 vdt-\int_2 vdt\right] \qquad (7)$$

This discussion has been concerned only with pure wave properties and it should apply generally to any wave form. We are here particularly interested in the application to the Quantum waves or the De Broyle waves associated with particles. Specifically the wave length $\lambda$ is associated with the momentum $\rho$ by the expression $$\frac{1}{\lambda}=\frac{\rho}{h} \qquad (8)$$

where $h$ is Planck's constant. Similarly, the frequency is associated with energy (E) by the expression $$v=\frac{E}{h} \qquad (9)$$

For the De Broyle waves then $$I=I_0\cos\frac{1}{\hbar}\left[\oint\rho dl+\int_1 Edt-\int_2 Edt\right] \qquad (10)$$

where the amplitude I is now the current strength. Thus a control of the current I is possible through the modulation applied to $\oint\rho dl$ or $\int Edt$.

Such a modulation is a pure "Quantum" effect and is not to be predicted from a classical view of matter. This becomes apparent when it is considered that any normally conductive wire arranged as shown in FIGURE 1 certainly does not exhibit such a modulation effect. In such a conductor the Quantum waves are scattered frequently in the normally conductive wire giving rise to the normal resistance of the wire and causing a smearing of the quantum effect into unobservable chaos. Only in a superconductor where there is no resistance and no phase destroying scattering can the Quantum effect be observed. However, the nature of a superconductor is such that the summation of the energies in path 1 and path 2 are identical in the absence of resistance. This is expressed mathematically as $$\int_1 Edt=\int_2 Edt \qquad (11)$$

and $$\oint\rho dl=Nh=\text{a constant number} \qquad (12)$$

From this it follows that I equals $I_0$ and no modulation is possible.

Figure 2:
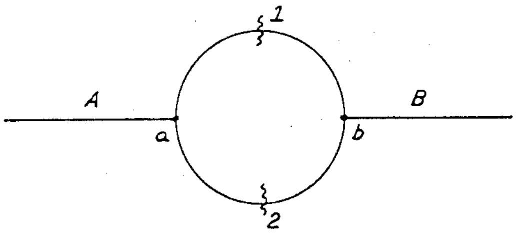
FIGURE 2 is a similar schematic showing with a junction in each branch.

The modulation of electron flow or electrical current has been made possible by the insertion of a junction or junctions in the circuit originally depicted in FIGURE 1 as shown in FIGURE 2. FIGURE 2 is identical to FIGURE 1 except that junctions represented by the symbol ⌇ have been inserted into path 1 and path 2. These junctions are constructed so as to permit the passage of super-currents and to simultaneously permit expression (12) to be modified as follows $$\oint\rho dl\neq Nh \qquad (13)$$

Under these circumstances an energy difference ($\Delta E$) must develop across either or both junctions (⌇) and the resultant super-current will be $$I=I_0\cos\frac{1}{\hbar}\left[\oint\rho dl-\int\Delta Edt\right] \qquad (14)$$

The canonical momentum ($\rho$) is composed of a mechanical momentum (mv.) and an electromagnetic component ($e$A). If the energy represented by $\Delta E$ is assumed but not restricted to be associated with a voltage (V), then the current may be written in full as follows $$I=I_0\cos\frac{1}{\hbar}\left[\oint MVdl+e\oint Adl-e\int Vdt\right] \qquad (15)$$

The expression $\oint Adl$ is defined as the magnetic flux ($\phi$). From expression (15) it follows that current is explicitly seen to be modulated by (1) a particle velocity ($v$)
(2) a magnetic flux ($\phi$)
(3) a voltage (V)

Modulation by each of these techniques has been observed in laboratory demonstrations. The junctions (⌇) employed in these demonstrations have included typical Josephson junctions which are essentially a thin insulating film barrier as well as a junction formed by a very narrow superconducting link.

The second term within the brackets in expression (15) may also be written as $e\phi$ and the expression (15) so requires that modulation of the super-current be obtainable by variation of the magnetic flux across the junction or junctions. Precisely this effect has been obtained experimentally using the interferometer shown schematically in FIGURE 2.

Figure 3:
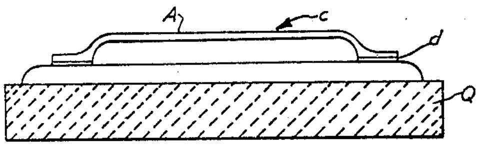
FIGURE 3 is an enlarged section of a specific type of junction structure.

The interferometer shown in section in FIGURE 3 was fabricated by evaporating a thin layer of tin $d$ about 1000 angstroms thick upon a quartz substrate (Q). The surface of this tin layer was oxidized in a gently heated oxygen atmosphere to produce a layer of tin oxide upon tin layer $d$. The central portion of tin layer $d$ was covered with a suitable insulating coating. In this case a coating known commercially as "Formvar" was employed. The "Formvar" layer has been designated A. A second tin layer $c$ was now evaporated over "Formvar" layer A and oxidized tin layer $d$. The two tin layers $c$ and $d$ form the two arms 1 and 2 of the device shown in FIGURE 2. Current is fed through this device by wires attached to films $c$ and $d$. The tin oxide layers act as the junctions (⌇).

This device was cooled in liquid helium to render the tin superconductive and the device was then subjected to a varying magnetic flux. When the maximum super-current permitted through this device is graphed against the flux density, the curve obtained is that represented by FIGURE 4. This graph clearly shows the flux period of $$h/e=2.07\times 10^{-7}\ \text{gauss/cm.}^2$$

Figure 4:
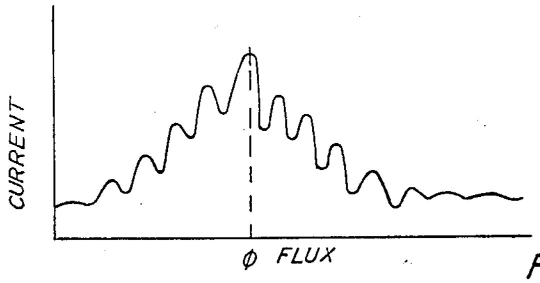
FIGURE 4 is a graph of magnetic flux against maximum super-current.
Figure 5:
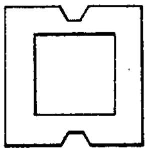
FIGURE 5 is a schematic showing of a further type of junction.
Figure 6:
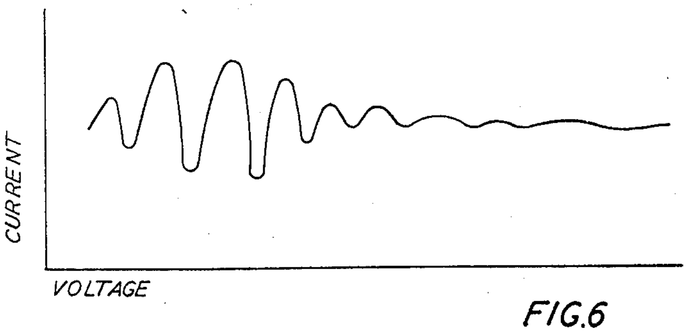
FIGURE 6 is a graph of voltage against super-current where voltage is employed to modulate the super-current.

This flux period appears to be perfectly general and is common to all superconductors which have been tested. The overall amplitude modulation of the super-current arises from a diffraction effect associated with the junctions themselves and is irrelevant to the establishment of the interference effect. The particular wave form displayed in FIGURE 4 is attributable to the characteristics of the particular experimental apparatus employed and is by no means to be construed as a limitation upon the type of modulation obtainable by this technique.

The first term enclosed in the brackets in expression (15) involves a velocity term and dictates that current modulation by means of velocity must be possible. The velocity modulation for a rotation ($\omega$) reduces to $$\frac{2M}{\hbar}A\omega$$

upon evaluating the integral. Expression (15) is thus an expicit function of the angular velocity $\omega$ and a periodic super-current modulation is expected as a function of the angular rotation rate similar to that described above with reference to flux modulation. Complete experimental confirmation has been obtained of this prediction. The interferometer depicted in FIGURE 3 was rotated about an axis perpendicular to area A. The predicted periodic modulation of super-currents introduced into this interferometer was obtained.

The final term within the brackets of expression (15) dictates that a time dependent modulation of current due to a voltage be obtainable. If an alternating voltage of frequency $\omega$ is impressed and is of the form $$V_0 S/M\omega t$$

the super-current of this frequency may be calculated to be of the form $$I = I_0 J_1\left(\frac{eV_0}{\hbar\omega}\right)$$

where $J_1$ is a Bessel function. This prediction has also received complete experimental confirmation.

The junctions described above have been either a thin layer of insulating material (tin oxide) or a very thin connecting link separating two superconducting masses. These are by no means the only types of junctions possible. The tin connecting link type of junction may be expanded to include any very minute connection between superconducting masses. For example, the type of contact obtained by pressing a pointed screw against a superconducting mass has been operated in this manner. It is not essential that the minute connecting link be a superconductive material. Any moderately conducting material will function. Theoretical considerations dictate that no actual contact is necessary but only that the two superconductors be separated by a very minute space of the order of ten angstroms. Experimental difficulties have precluded actual use of this approach to date.

The devices described in detail above all relate to the use of at least two paths for the super-current each of which contain a junction. These devices have been described in detail along with the theory of their operation to assist in the understanding of the device to which this specification is directed.

This specification is concerned with a superconducting quantum interference device in which only one junction is employed. At first blush it would appear that interference could be achieved in the earlier devices by simply eliminating one of the junctions since it is sufficient to control the phase along only one path. The other path would then be a solid conductor with no phase control element in it. However, the usual circuits used to detect quantum interference are shorted out or shunted by such a superconducting path which contains no weak link. That is, a critical current at the weak link cannot be achieved because all of the applied current will flow through the superconducting path ignoring the weak link.

This specification describes a superconducting quantum interference device which has only one weak link in parallel with a superconducting path and which utilizes the inductance of this superconducting path to provide sufficient impedance to allow a critical superconducting current to be achieved in the weak link. For example, such a device has a superconducting path of inductance L and is operated at a frequency such that $\omega L$ (the inductive reactance at frequency $\omega$) will be detectable. In practice, this reactance may be as low as $10^{-3}$ ohms. Such a single weak link device will have a response which is periodic in the applied magnetic field and hence can be used as a magnetometer. Since the sensitivity to magnetic fields can be made very great, an amplifier could be constructed in which the input signal provides the magnetic field.

Figure 7:
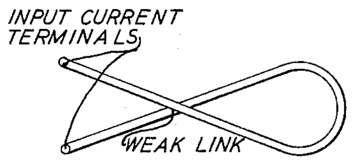
FIGURE 7 is a schematic showing of a device especially adapted to the execution of the instant invention.

A single junction superconducting quantum interference device may be constructed from a single loop of wire as shown in FIGURE 7. The junction or weak link in this case is provided by a light mechanical contact formed where the wire crosses itself. Typically this junction may be maintained by a pressure of the wires upon each other of about five grams. The loop is formed of a loop of niobium wire with a diameter of 5 mils. It is to be understood that other known types of junctions may be substituted for the simple junction shown in FIGURE 7. When an alternating current of sufficiently high frequency is imposed across the ends of the loop shown in FIGURE 7, the reactance of the loop will develop a difference of potential between the ends of the loop despite the fact that the loop is in a superconducting state. This difference of potential is sufficient to cause a current to flow across the junction, shunting to some extent the superconductor.

Figure 8:
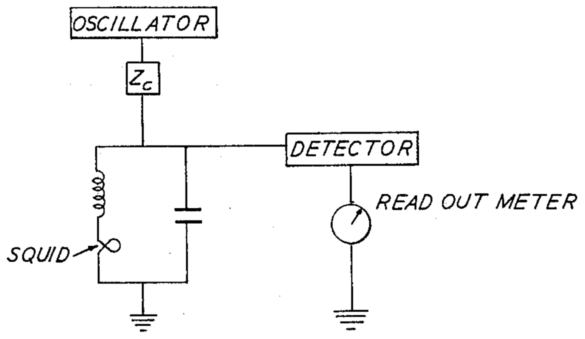
FIGURE 8 is a circuit employing a relatively low frequency current and a superconducting quantum interference device as a magnetometer.
Figures 9, 10:
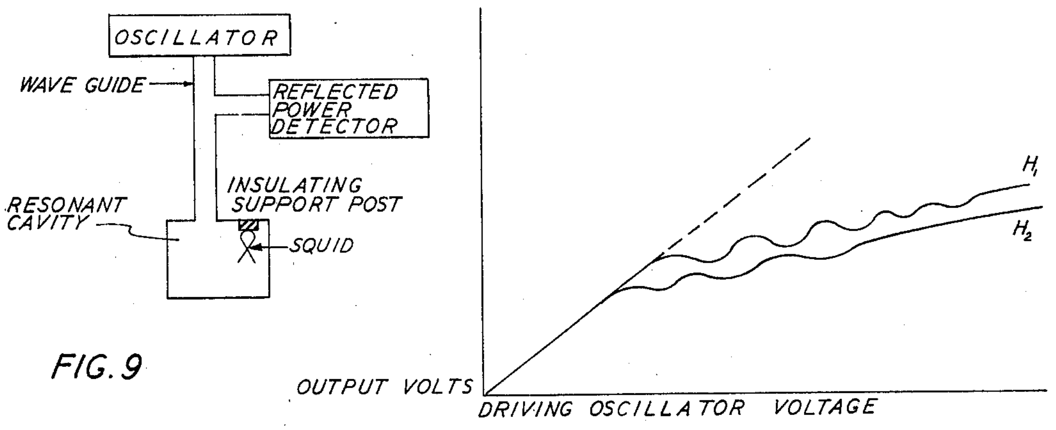
FIGURE 9 is a circuit employing a higher frequency current and a superconducting quantum interference device as a magnetometer.
FIGURE 10 depicts the results obtained with the apparatus shown in FIGURE 8.

FIGURES 8 and 9 show some circuits which have been used to couple to these very low impedance superconducting quantum interference devices so that the quantum interference phenomenon could be observed. FIGURE 8 shows a circuit used in the frequency range of 10 megacycles while FIGURE 9 shows a circuit which was used in the frequency range near 10 kilomegacycles. The parallel resonant circuit with elements $L_0$ and $C_0$ in FIGURE 8 could be replaced by any resonant elements with lumped constants or with distributed impedance elements. The superconducting quantum interference device is connected at a low impedance, high current position of the resonant element. FIGURE 10 shows the variation of the detector output as a function of driving oscillator voltage for the circuit shown in FIGURE 8 when two different fields $H_1$ and $H_2$ are applied to the superconducting quantum interference device.

Figure 11:
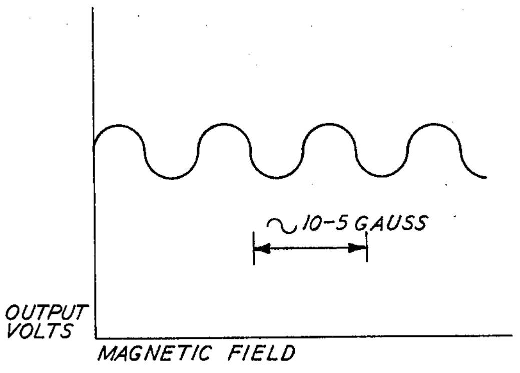
FIGURE 11 is a typical representation of the periodicity of a superconducting device as the magnetic field is changed.

FIGURE 11 shows the variation of the output voltage with magnetic field at a fixed driving oscillation voltage. Each cycle of output voltage corresponds to a change in magnetic flux threading the loop of the superconducting quantum interference device by one flux quantum, i.e., $2\times10^{-7}$ gauss cm.$^2$. Wire loop superconducting quantum interference devices similar to the one shown in FIGURE 7 showed outputs with periods in the range of 10 microgauss. The important circuit parameters in the circuit of FIGURE 8 are the quality factor, Q, of the resonant circuit and the impedance $\omega L_0$. The coupling impedance $Z_c$ must be larger than $Q\omega L_0$ and the driving voltage must be at a frequency which resonates the $L_0C_0$ tank circuit and of such a magnitude that it drives the critical superconducting current through the weak link. This is usually a current of 1–10 microamperes.

The microwave circuit shown in FIGURE 9 is very similar to the lower frequency circuit of FIGURE 8 except that the resonant element is a cavity and the coupling to the superconducting quantum interference device is through the electric field in the cavity. This coupling is controlled by the position and orientation of the superconducting quantum interference device in the cavity. Note that no electrical connections to the superconducting quantum interference device are required. At microwave frequencies the detection system may simply measure the microwave power reflected from the cavity or it may be in the form of a balanced bridge which detects changes in the effective impedance of the cavity. In either case, there is a level of input power at which a critical current is reached in the superconducting quantum interference device. At this level and above the cavity response becomes a periodic function of any magnetic field applied to the superconducting quantum interference device. Thus the output of the entire system can be controlled by magnetic fields in the microgauss range applied to the superconducting quantum interference device.

What is claimed is:

1. A superconductive quantum interference device comprising a superconductive inductive reactive element, a single junction shunting said superconductive reactive element, said superconductive inductive reactive element and said single junction enclosing a finite area for reception of magnetic flux, means coupled to said superconductive inductive reactive element for applying an alternating potential to said superconductive inductive reactive element of sufficiently high frequency to cause current to flow through said junction and means coupled to said quantum interference device for detecting quantum interference effects in said device.

2. The superconductive quantum interference device of claim 1 in which the inductance of said superconductive inductive reactive element is sufficiently high to cause said alternating potential to produce a sufficiently high inductive reactance in said superconductive inductive reactive element that the potential difference across said junction causes current flow through said junction.

3. The combination of claim 2 in which said superconductive inductive reactive element comprises a loop of superconductive material and said junction is positioned between said superconductive material.

4. The combination of claim 3 in which the ends of said superconductive material form leads and said junction is positioned adjacent said ends.

5. The combination of claim 4 in which said junction is formed by contacting the superconductive material of said superconductive inductive reactive element under light pressure.

6. The combination of claim 4 in which said means for applying an alternating potential to said loop is connected to the ends of said loop.

7. The combination of claim 2 in which said means for applying an alternating potential to said superconductive inductive reactive element comprises a resonant microwave cavity and said superconductive quantum interference device is placed in said resonant microwave cavity.

8. The combination of claim 2 including means for applying a magnetic field through said finite area, and means coupled to said quantum interference device for detecting the change in voltage across said junction, said change in voltage being periodic with respect to the magnitude of the applied magnetic field through said finite area.

9. The combination of claim 2 including means for applying a time varying magnetic field through said finite area, and means coupled to said quantum interference device for detecting a time varying voltage across said junction, the amplitude of said time varying voltage being a function of the time varying magnetic field.

10. The combination of claim 1 in which an oscillator is coupled to said quantum interference device, said oscillator including means for varying the magnitude of the oscillating voltage applied to said quantum interference device, means for applying a magnetic field through the finite area enclosed by said superconductive inductive reactive element and said single junction, and means coupled to said quantum interference device for detecting changes in output voltage from said quantum interference as a function of the variations in magnitude of said oscillating voltage and said magnetic field.

11. The combination of claim 10 in which said quantum interference device is positioned in a microwave resonant cavity and said microwave resonant cavity is coupled to said oscillator, and said means for detecting changes in the output voltage from said quantum interference device comprises a reflected power detector coupled to said microwave resonant cavity.

12. The combination of claim 10 in which said oscillator is coupled to said quantum interference device through a resonant frequency circuit, said quantum interference device being positioned at a low impedance, high current position of said resonant frequency circuit.

13. A magnetometer comprising a superconductive inductive reactive element, a single junction shunting said superconductive inductive reactive element, said superconductive inductive reactive element and said single junction enclosing a finite area for the reception of magnetic flux, means coupled to said superconductive inductive reactive element for applying an alternating potential to said superconductive inductive reactive element of sufficiently high frequency to cause current to flow through said junction, and means coupled to said magnetometer for detecting the magnetic field through said finite area.

14. A process for effecting a superconductive interference comprising forming a superconductive inductive reactive element and a junction shunting said superconductive inductive reactive element in a loop enclosing a finite area, applying an alternating potential of sufficiently high frequency to said superconductive inductive reactive element to cause current flow through the junction, and detecting quantum interference effects in the junction.

15. The process of claim 14 including applying a magnetic field through said finite area.

16. The process of claim 15 in which the magnetic field through the finite area varies in magnitude.

17. The process of claim 15 in which the magnetic field through the finite area is a time varying magnetic field.

References Cited

UNITED STATES PATENTS

| | | | |
|---|---|---|---|
| 3,047,744 | 7/1962 | Pankove | 307—245 |
| 3,196,427 | 7/1965 | Mann et al. | 340—347 |
| 3,281,609 | 10/1966 | Rowell | 340—173.1 |
| 3,335,363 | 8/1967 | Anderson et al. | 324—43 |
| 3,363,200 | 1/1968 | Jaklevic et al. | 307—306 |
| 3,370,210 | 2/1968 | Fiske | 307—306 |

RUDOLPH V. ROLINEC, Primary Examiner

R. J. CORCORAN, Assistant Examiner

U.S. Cl. X.R.

307—306; 330—63; 332—51